US006046693A

United States Patent [19]

Wu

[11] Patent Number: 6,046,693

[45] Date of Patent: Apr. 4, 2000

[54] CIRCUIT FOR ACCURATELY CONVERTING ANALOG VIDEO SIGNALS OUTPUT FROM A VGA CARD INTO DIGITAL VIDEO SIGNALS

[75] Inventor: Ming-Te Wu, Pan Chiao, Taiwan

[73] Assignee: Amtran Technology Co., Ltd., Taipei Shen, Taiwan

[21] Appl. No.: 09/138,094

[22] Filed: Aug. 21, 1998

[30] Foreign Application Priority Data

May 29, 1998 [TW] Taiwan ................................ 87108578

[51] Int. Cl.[7] ............................... H03M 1/12; H04N 7/18

[52] U.S. Cl. ............................................ 341/155; 348/537

[58] Field of Search ..................................... 341/155, 110; 348/537, 446, 524, 552, 540; 327/157

[56] References Cited

U.S. PATENT DOCUMENTS

| | | | |
|---|---|---|---|
| 5,663,767 | 9/1997 | Rumreich et al. | 348/537 |
| 5,767,916 | 6/1998 | West | 348/537 |
| 5,841,482 | 11/1998 | Wang et al. | 348/537 |

*Primary Examiner*—Brian Young
*Assistant Examiner*—Patrick Wamsley
*Attorney, Agent, or Firm*—Bacon & Thomas

[57] ABSTRACT

The present invention provides a special designed circuit in which some low-cost CPUs (low-level CPUs such as 8051 or 6805) and some simple circuit elements are incorporated to achieve the object of converting analog video signals output from a VGA card into digital video signals. Such circuit is advantageous in that the cost is very low and the conversion from analog signal to digital signal can be performed accurately.

6 Claims, 7 Drawing Sheets

CIRCUIT FOR ACCURATELY CONVERTING ANALOG VIDEO SIGNALS OUTPUT FROM A VGA CARD INTO DIGITAL VIDEO SIGNALS

BACKGROUND OF THE INVENTION

1. Field of the Invention

This invention relates to a circuit for accurately converting analog video signals output from a video graphic array (hereinafter referred as VGA) card into digital video signals, and more particularly to a circuit for converting analog video signals output from a VGA card into digital video signals served to a liquid crystal display (hereinafter referred as LCD) panel.

2. Description of the Prior Art

Since cathode ray tube (hereinafter referred as CRT) color monitors adopt analog signals as input, commercial VGA cards are all designed to be adapted to this manner. Besides, commercial VGA cards have various resolutions, and thus have various output frequencies. For CRT multi-frequency color monitors, there are various designs and applications.

Since the volume of an LCD panel (or referred as an LCD monitor) is much smaller than that of a CRT monitor, with the progress in LCD technologies, LCD monitors will gradually take the place of conventional CRT monitors in the future. Accordingly, it is significant to display the analog video signals output from VGA cards on the LCD monitors.

In order to display the analog video signals output from VGA cards on the LCD monitors, there are many problems to be solved. First, commercial LCD monitors do not have the functions of multi-frequency and multi-resolution. For example, it is impossible to acquire an 800*600 resolution on an LCD monitor having a 1024*768 resolution. Accordingly, when an LCD monitor is used to display a video signal, if different resolutions are required, the video signal must be processed to be converted into signals which can be served to the LCD monitor.

Second, since the LCD monitor is operated in the digital manner, the analog video signals output from a VGA card must be converted into digital signals by an analog-to-digital converter (hereinafter referred as A/D converter) to be displayed on the LCD monitor. A video signal is composed of a majority of pixels, each of which is to be precisely converted into a digital signal, which is involved with synchronization and phase alignment.

Furthermore, the way how the video signals can be displayed on the correct positions of an LCD monitor must be solved as well.

Commercial analog LCD multi-frequency color monitors have following disadvantages: (1) To overcome the problems of multi-frequency and different resolutions, auto-detecting or manual tuning has to be utilized; (2) Manual tuning has to be performed such that video signals are displayed at adequate positions; and (3) Manual tuning is indispensable to stablize the displayed image, however, most users cannot do this.

On the other hand, although some products are asserted to be able to perform auto-tuning, the associated accuracy cannot satisfy our requirements and some special image patterns are needed to efficiently perform the auto-tuning. However, such special image patterns are not usually obtainable for practical computer applications.

FIG. 1 illustrates a block diagram for converting analog video signals into digital video signals in a conventional analog LCD multi-frequency color monitor. FIG. 2 shows an ideal timing for converting an analog signal into digital signals accurately, wherein each active edge (trailing edge) of the clock signal A/D CLOCK corresponds to the middle of a pixel. Therefore, each pixel can be accurately converted into a digital signal.

In order to achieve the above object, the following conditions must be satisfied: (1) The frequency of the clock signal A/D CLOCK must be the same as that of the pixel frequency of the original video signal, no error is allowed. This frequency is determined by a phase-locked loop of the VGA card, which cannot be predicted in advance by the user; and (2) Under the situation that the frequency is correct, the phase is needed to be accurately aligned such that correct digital signals can be derived.

FIG. 3 illustrates the situation that the frequency of the clock signal A/D CLOCK is not the same as the pixel frequency of the original video signal. Since it is impossible to make each active edge of the A/D CLOCK corresponds to the middle of a pixel, sampling results may be wrong or ambiguous, which results in bad images on the LCD monitor.

To search for the desired pixel frequency accurately, a digital signal processor can be utilized, whose disadvantage is that since the pixel frequency is quite high (about 10 MHz~100 MHz), even ordinary digital signal processor cannot be realized easily and the cost is very expensive.

SUMMARY OF THE INVENTION

In view of this, the invention provides a special designed circuit in which some low-cost CPUs (low-level CPUs such as 8051 or 6805) and some simple circuit elements are incorporated to achieve the object of converting analog video signals output from a VGA card into digital video signals. Such circuit is advantageous in that the cost is very low and the conversion from analog signal to digital signal can be performed accurately.

Referring to FIG. 7, a circuit in accordance with the present invention for accurately converting analog video signals output from a VGA card into digital video signals comprise: a clock signal synthesizer 1 receiving a synchronizing signal and a frequency indicating signal output from a CPU, and outputting a clock signal A/D CLOCK having the same frequency as the pixel frequency; a video signal processor 2 receiving an analog video signal output from a VGA card and a constant signal, and outputting a signal according to the comparison result of the two input signals; a D flip-flop with CLK terminal receiving the signal output from the video signal processor 2 and D terminal receiving the clock signal A/D CLOCK output from the clock signal synthesizer 1; a D/A converter receiving a phase indicating signal from the CPU, and outputting an analog signal corresponding to the phase indicating signal; a CPU connected to the Q terminal of the D flip-flop outputting the frequency indicating signal and the phase indicating signal, which are sent to the clock signal synthesizer 1 and the D/A converter, respectively according to the Q value of the D flip-flop; a phase delaying circuit 6 receiving a horizontal synchronizing signal output from a VGA card and the output signal of the D/A converter, delaying the phase of the horizontal synchronizing signal according to the output signal of the D/A converter, this phase-delayed horizontal synchronizing signal then being supplied to the clock signal synthesizer 1 as its synchronizing signal; and an A/D converter receiving an analog video signal output from the VGA card and a clock signal A/D CLOCK output from the clock signal synthesizer 1, and outputting a digital video signal which is the output signal of the whole circuit.

FIG. 8 is a flow chart showing how the aforementioned circuit operates, which can be divided into two parts: the first part (the upper half of FIG. 8) and the second part (the upper half of FIG. 8). In the first part, the frequency of the output digital signal is first tuned to be the same as the pixel frequency. In the second part, the frequency of the digital signal is fixed and the phase of the digital signal is tuned.

The first part is progressed in accordance with the following steps:

(1-1) Check the Q value of the D flip-flop, if Q is a constant, the frequency of the digital video signal output from the A/D converter has been the same as the pixel frequency, then the first part is finished, otherwise proceed to (1-2).

(1-2) The CPU emits a phase indicating signal to the D/A converter, the D/A converter thus outputs an analog signal which causes the phase delaying circuit 6 to delay the phase of the input horizontal synchronizing signal, the phase of the output clock signal of the clock signal synthesizer 1 is thus delayed. Proceed to (1-3) thereafter.

(1-3) Check if the phase delay of the clock signal has exceeded one period, proceed to (1-1) if not yet, proceed to (1-4) otherwise.

(1-4) The CPU emits the phase indicating signal to the clock signal synthesizer 1, which changes the frequency of the output clock signal, then go back to (1-1).

The second part is progressed in accordance with the following steps:

(2-1) The CPU emits a phase indicating signal to the D/A converter, which causes the phase of the output clock signal of the clock signal synthesizer 1 being delayed. Proceed to (2-2) thereafter;

(2-2) Check the Q value, if Q is not constant, the output digital video signal of the A/D converter is desired, the second part is finished, otherwise go back to (2-1).

DESCRIPTION OF THE PREFERRED EMBODIMENT

Figure 1:
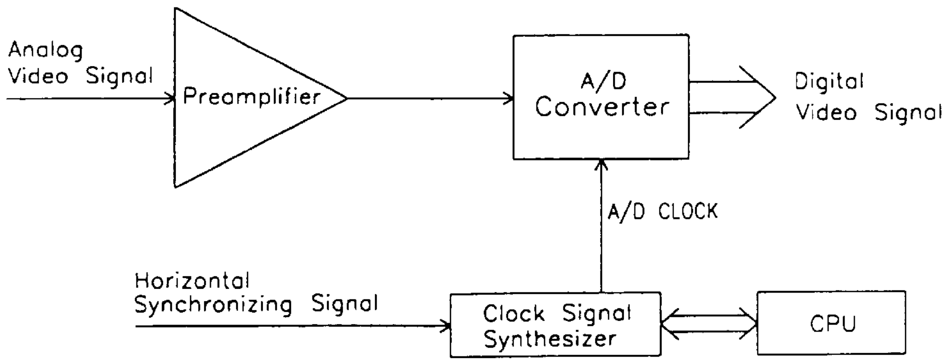
FIG. 1 (PRIOR ART)
FIG. 1 is a block diagram for converting analog video signals into digital video signals in a conventional analog LCD multi-frequency color monitor.
Figure 4:
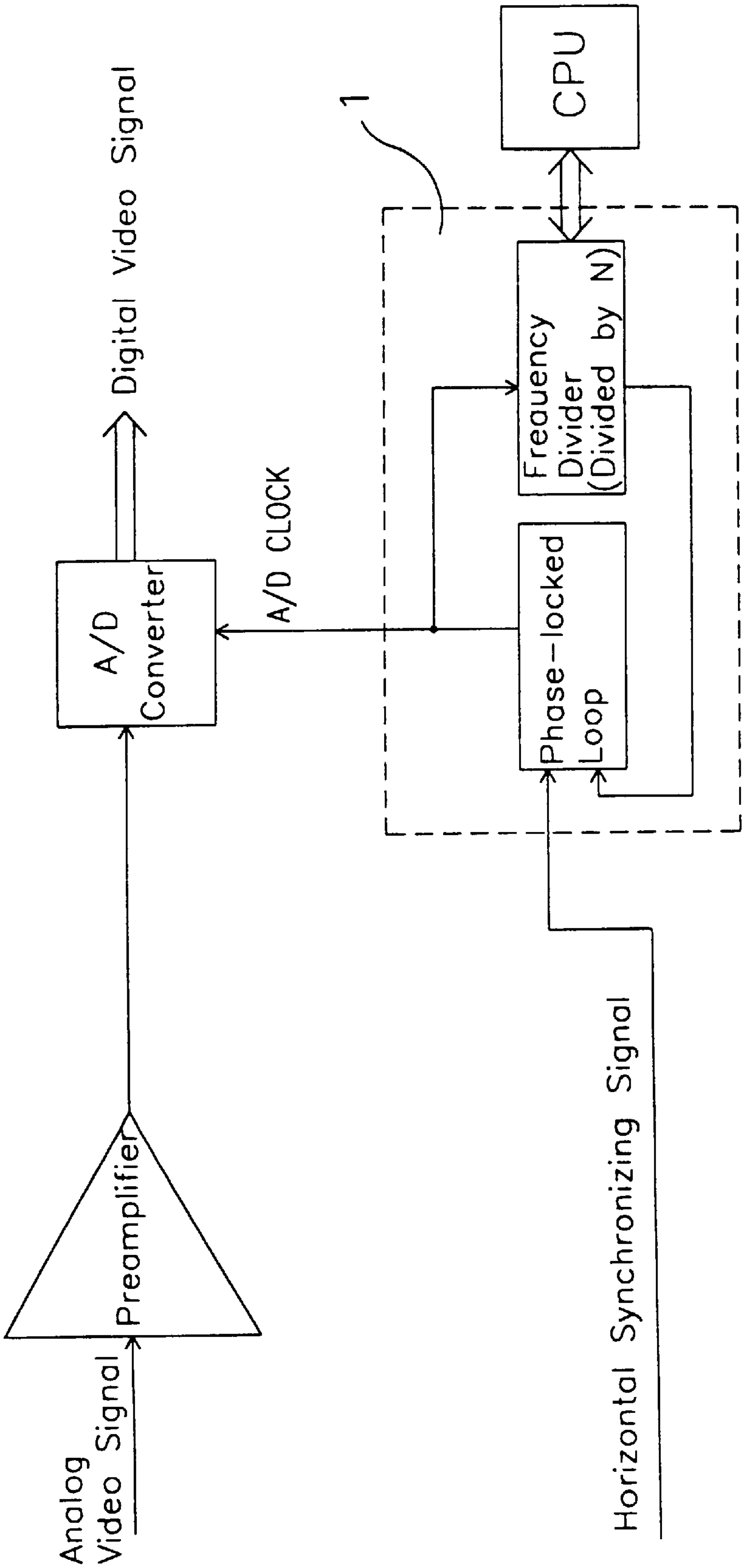
FIG. 4 (PRIOR ART)
FIG. 4 is a more detailed block diagram corresponding to FIG. 1.

Referring to FIG. 4, it differs from FIG. 1 in that the clock signal synthesizer in FIG. 1 is more detailed decomposed into the phase-locked loop and the frequency divider. In FIG. 4, the frequency of the output clock signal A/D CLOCK of the clock signal synthesizer 1 is determined by the horizontal synchronizing signal supplied to the phase-locked loop and the feedback signal N from the frequency divider. Since the pixel frequency of a video signal is determined by a video signal generator or a VGA card, the N value cannot be predicted.

Figure 2:
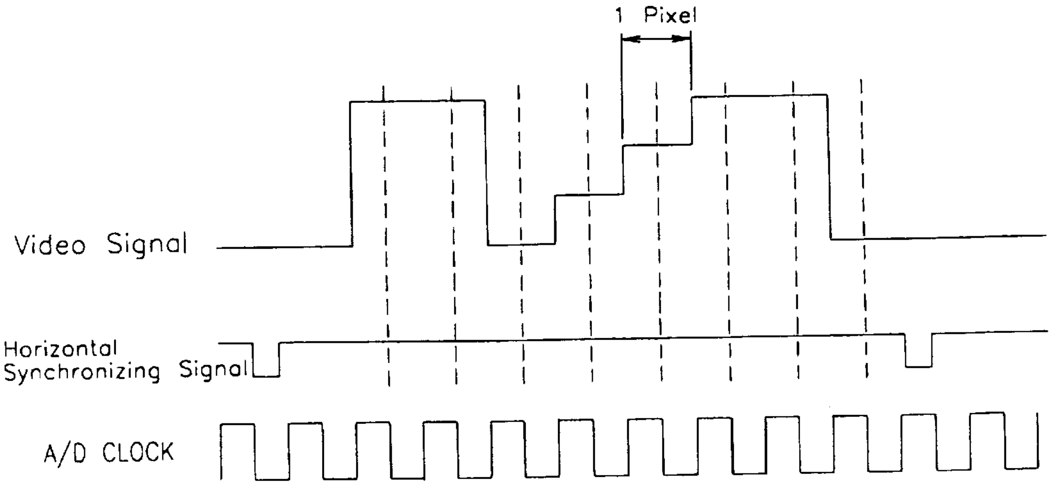
FIG. 2 (PRIOR ART)
FIG. 2 shows an ideal timing for converting analog signals into digital signals accurately.
Figure 3:
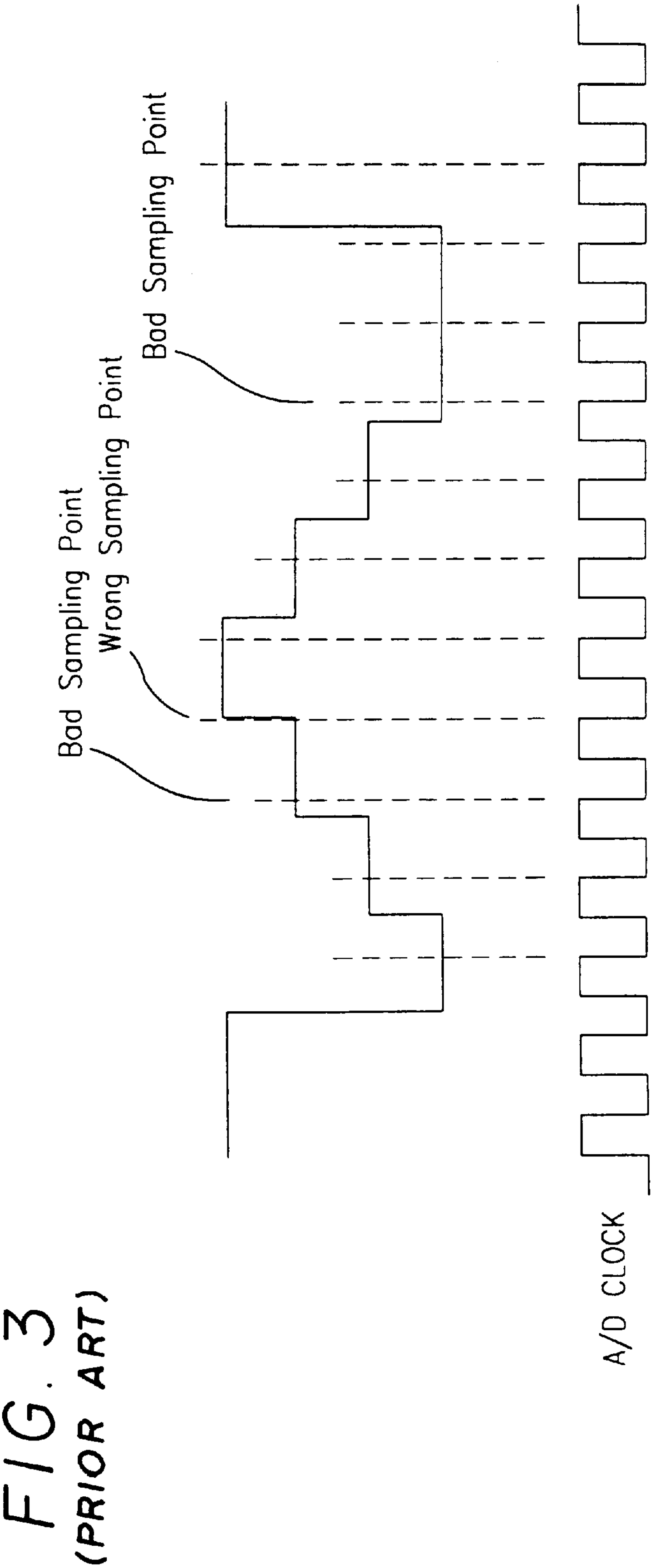
FIG. 3 (PRIOR ART)
FIG. 3 illustrates the situation that the frequency of the clock signal A/D CLOCK is not the same as the pixel frequency of the original video signal.

Referring to FIG. 2, in order to accurately convert analog video signals output from a VGA card into digital video signals, the pixel frequency and the pixel phase of a video signal must be the same as the frequency and the phase, respectively, of the clock signal A/D CLOCK. In order to achieve this object, referring to FIG. 5, one can use a high-speed comparator or amplifier to convert an analog video signal output from a VGA card into a logic level. Then a D flip-flop is utilized to detect whether the pixel frequency and the pixel phase of a video signal are the same as the frequency and the phase, respectively, of the clock signal A/D CLOCK, which is explained in more detail as follows. The output signal of the high-speed comparator is supplied to the CLK terminal of the D flip-flop; and the A/D CLOCK is supplied to the D terminal of the D flip-flop. In this way, the Q value will be constant if the frequency and the phase of the A/D CLOCK are the same as the frequency and the phase of the video signal; on the contrary, the Q value will fluctuate if the frequencies of the two are different. One can monitor the Q value merely by use of an usual CPU.

It is to be noted that improper phase may still exist under the situation that the pixel frequency is the same as the frequency of the A/D CLOCK.

The phase deviation comes from the transmission delay of the circuit itself or the video signal itself, which cannot be accurately evaluated. Therefore, the phase of the A/D CLOCK must be adjusted. The evaluation of the phase is described as follows.

As described in the above, the pixel frequency may range from 10 MHz to over 100 MHz, which is difficult to be delayed accurately by the use of logic gates or other IC components. Therefore, it is usually implemented by analog circuits. However, the cost of such circuit is high because the operating frequency is quite high. In view of this, the present invention provides a unique way to adjust the phase of the A/D CLOCK.

Since the A/D CLOCK is generated by a phase-locked loop, a phase-locked loop operates according to the phase of a horizontal synchronizing signal, and the phase of a horizontal synchronizing signal can be considered to be the same as that of a video signal. Therefore, one can delay the phase of the A/D CLOCK by delaying the phase of the horizontal synchronizing signal. This provides an advantage that phase delaying can be achieved by the use of simple circuit such as RC delaying circuit since the frequency of a horizontal synchronizing signal is merely a few decade KHz, as shown in FIG. 6.

Figure 5:
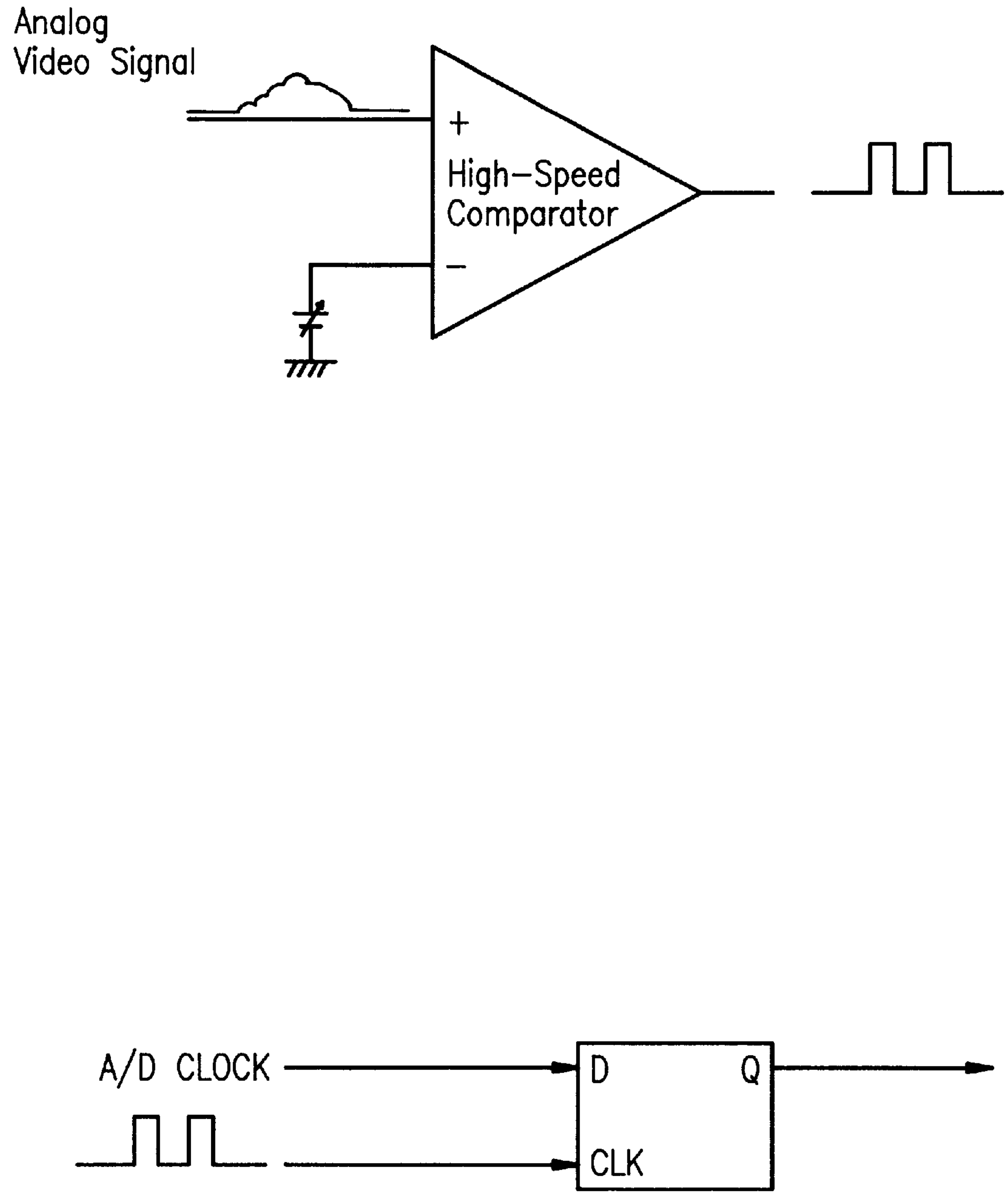
FIG. 5 shows how to judge whether the pixel frequency and pixel phase of a video signal are the same as the frequency and the phase of the clock signal A/D CLOCK using a high-speed comparator and a D flip-flop.
Figure 6:
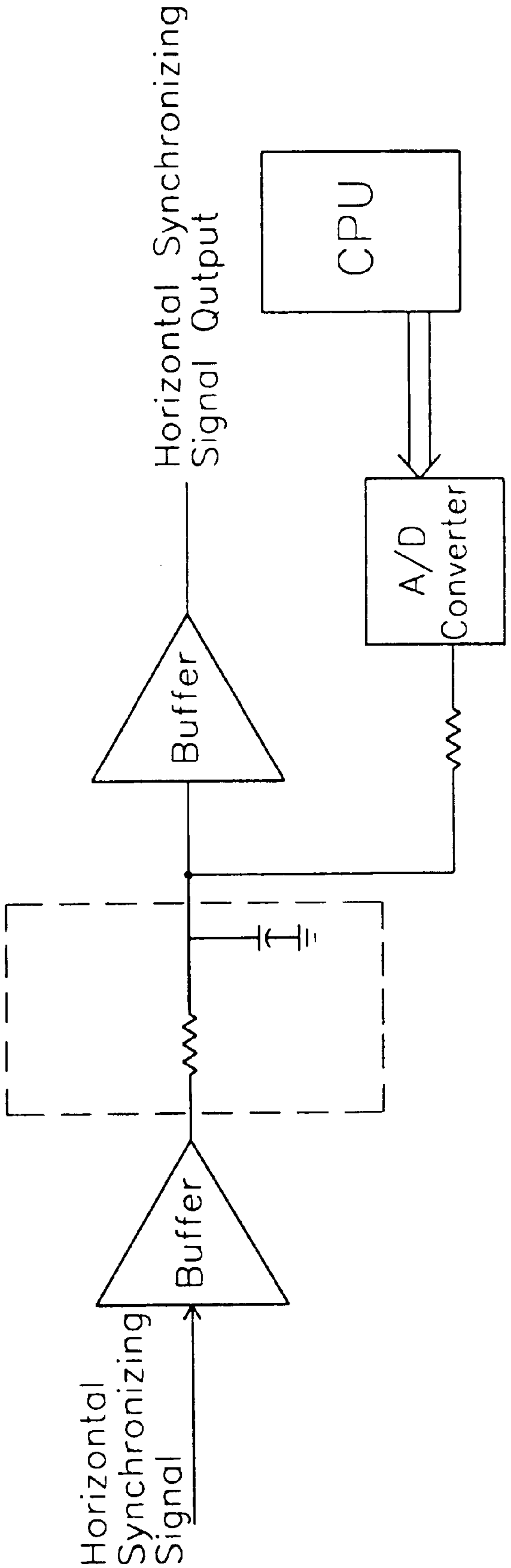
FIG. 6 shows how the phase of the A/D CLOCK is tuned by using a simple RC phase delaying circuit.
Figure 7:
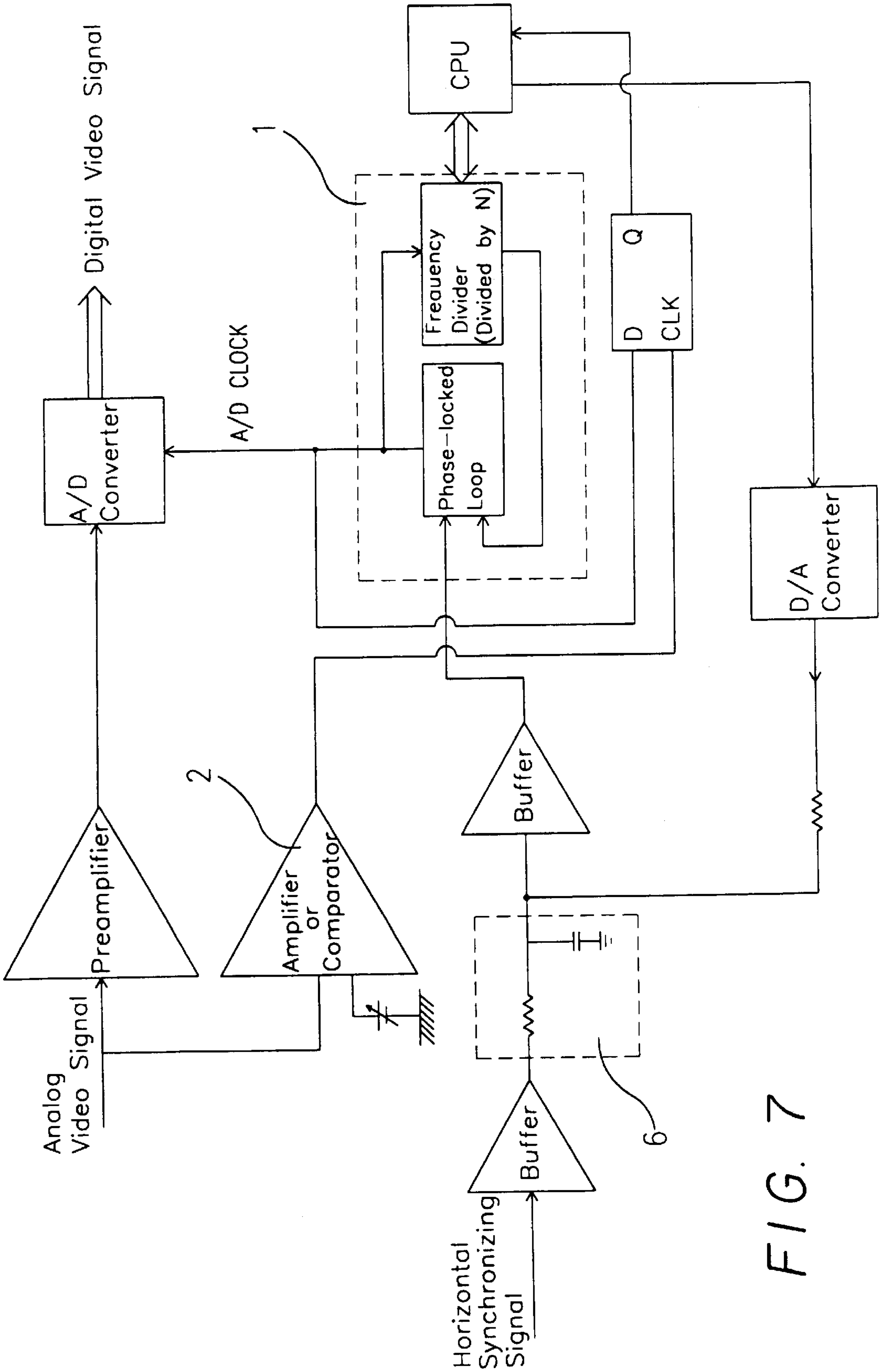
FIG. 7 shows a circuit in accordance with the present invention, which accurately converts analog video signals output from a VGA card into digital video signals.
Figure 8:
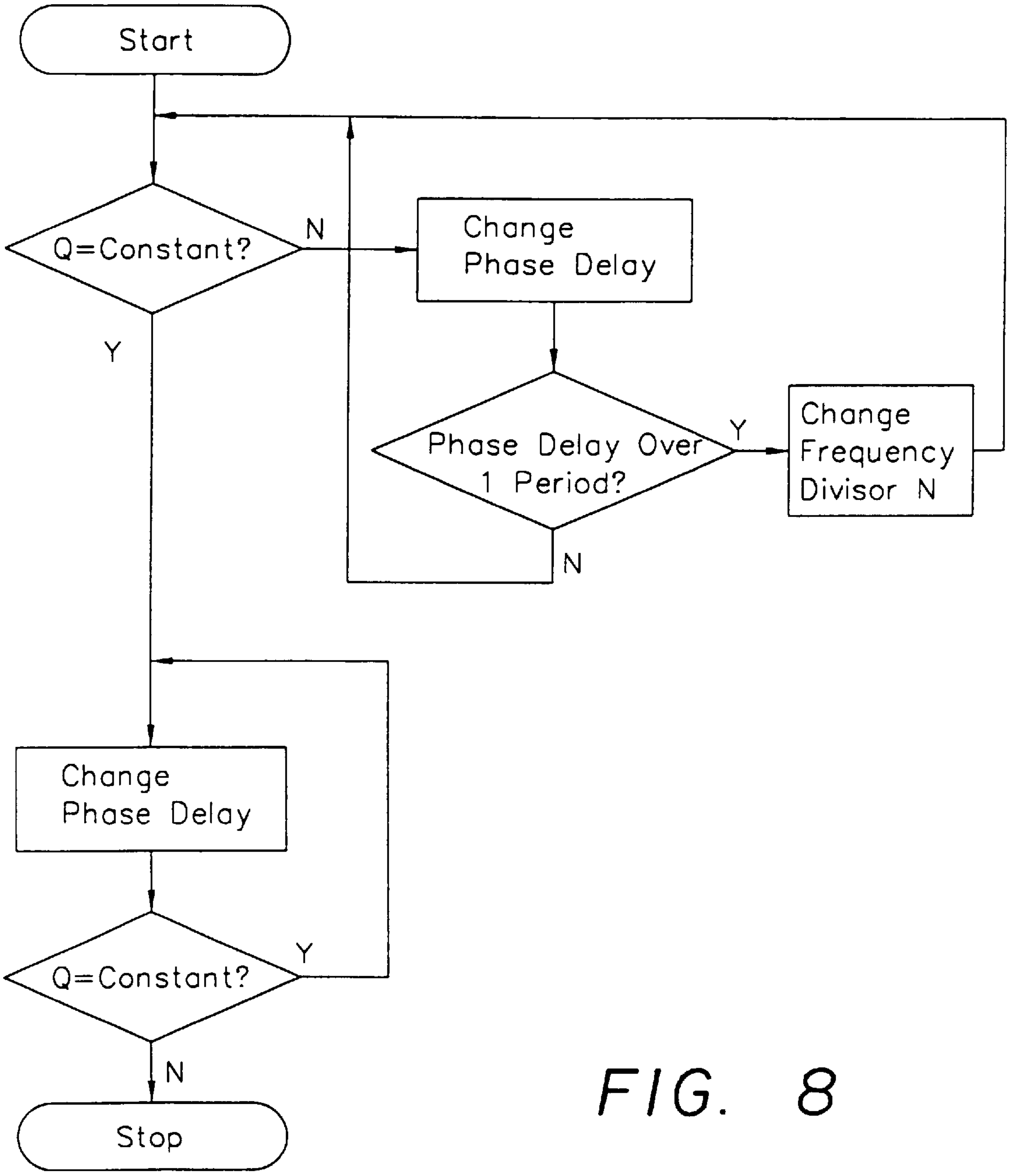
FIG. 8 is a flow chart showing how the circuit shown in FIG. 7 operates.

When the circuits of FIG. 5 and FIG. 6 are incorporated into the circuit of FIG. 4, the circuit of FIG. 7 is derived, which is the circuit in accordance with the present invention for converting analog video signals output from a VGA card into digital video signals.

While the present invention has been described with reference to the specific embodiments, the description is only illustrative and is not to be construed as limiting the invention. Various modifications and applications can be made without departing from the spirit and scope of the following claims.

What is claimed is:

1. A circuit for accurately converting analog video signals output from a VGA card into digital video signals, comprising:

a clock signal synthesizer receiving a synchronizing signal and a frequency indicating signal output from a CPU, and outputting a clock signal A/D CLOCK having the same frequency as the pixel frequency;

a video signal processor receiving an analog video signal output from a VGA card and a constant signal, and outputting a signal according to the comparison result of the two input signals;

a D flip-flop with CLK terminal receiving the signals output from the video signal processor and D terminal receiving the clock signal A/D CLOCK output from the clock signal synthesizer;

a D/A converter receiving a phase indicating signal from the CPU, and outputting an analog signal corresponding to the phase indicating signal;

a CPU connected to the Q terminal of said D flip-flop outputting said frequency indicating signal and said phase indicating signal, which are sent to said clock signal synthesizer and said D/A converter, respectively according to the Q value of the D flip-flop;

a phase delaying circuit receiving a horizontal synchronizing signal output from a VGA card and the output signal of said D/A converter, and delaying the phase of the horizontal synchronizing signal according to the output signal of said D/A converter, this phase-delayed horizontal synchronizing signal then being supplied to said clock signal synthesizer as its synchronizing signal; and an A/D converter receiving an analog video signal output from the VGA card and a clock signal A/D CLOCK output from said clock signal synthesizer, and outputting a digital video signal which is the output signal of the whole circuit, the whole circuit being operated as follows: in the first part, the frequency of the output digital signal being first tuned to be the same as the pixel frequency; in the second part, the frequency of the digital signal being fixed and the phase of said digital signal is tuned, the first part being progressed in accordance with the following steps:

(1-1) checking the Q value of said D flip-flop, if Q value being constant, the frequency of the digital video signal output from said A/D converter being the same as the pixel frequency, then the first part being finished, otherwise proceeding to (1-2);

(1-2) the CPU emitting said phase indicating signal to said D/A converter, said D/A converter thus outputting an analog signal which causes said phase delaying circuit to delay the phase of the input horizontal synchronizing signal, the phase of the output clock signal of said clock signal synthesizer thus being delayed, then proceeding to (1-3);

(1-3) checking if the phase delay of the clock signal has exceeded one period, proceeding to (1-1) if not, proceeding to (1-4) otherwise;

(1-4) the CPU emitting the phase indicating signal to said clock signal synthesizer, which changes the frequency of the output clock signal, then returning to (1-1), the second part being progressed as follows:

(2-1) the CPU emitting the phase indicating signal to said D/A converter, which causes the phase of the output clock signal of said clock signal synthesizer being delayed, then proceeding to (2-2);

(2-2) checking the Q value, if Q value being not constant, the output digital video signal of said A/D converter being desired, the second part being finished, otherwise returning to (2-1).

2. A circuit for accurately converting analog video signals output from a VGA card into digital video signals according to claim 1, further comprising a preamplifier, for preamplifying analog video signals output from said VGA card, then supplying them to said A/D converter.

3. A circuit for accurately converting analog video signals output from a VGA card into digital video signals according to claim 1, wherein said video signal processor is an amplifier.

4. A circuit for accurately converting analog video signals output from a VGA card into digital video signals according to claim 1, wherein said video signal processor is a comparator.

5. A circuit for accurately converting analog video signals output from a VGA card into digital video signals according to claim 1, further comprising the first buffer and the second buffer, said first buffer providing a temporary loading position before the horizontal synchronizing signal output from said VGA card being sent to said phase delaying circuit; said second buffer providing a temporary loading position before the synchronizing signal output from said phase delaying circuit being sent to said clock signal synthesizer.

6. A circuit for accurately converting analog video signals output from a VGA card into digital video signals according to claim 1, wherein said phase delaying circuit is an RC circuit.

* * * * *